United States Patent
Sakano

(10) Patent No.: US 8,257,126 B2
(45) Date of Patent: Sep. 4, 2012

(54) EVALUATION METHOD OF DEVICE LAYER STRUCTURE DESIGN FOR LIGHT EMITTING DEVICE, EVALUATION APPARATUS AND LIGHT EMITTING DEVICE

(75) Inventor: Fumihiro Sakano, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 220 days.

(21) Appl. No.: 12/669,697

(22) PCT Filed: Jun. 26, 2008

(86) PCT No.: PCT/JP2008/061626
§ 371 (c)(1),
(2), (4) Date: Jan. 19, 2010

(87) PCT Pub. No.: WO2009/013970
PCT Pub. Date: Jan. 29, 2009

(65) Prior Publication Data
US 2010/0194261 A1    Aug. 5, 2010

(30) Foreign Application Priority Data
Jul. 23, 2007   (JP) ................. 2007-191086

(51) Int. Cl.
*F23Q 23/08*    (2006.01)
(52) U.S. Cl. ............. 445/3; 445/4; 445/63; 445/64; 313/506
(58) Field of Classification Search .............. 445/3, 4, 445/63, 64; 313/498–512
See application file for complete search history.

(56) References Cited

U.S. PATENT DOCUMENTS

| | | | | |
|---|---|---|---|---|
| 7,098,589 B2 * | 8/2006 | Erchak et al. | ................. | 313/498 |
| 7,301,271 B2 * | 11/2007 | Erchak et al. | ................. | 313/498 |
| 7,362,047 B2 * | 4/2008 | Song et al. | ................... | 313/506 |
| 7,432,649 B2 * | 10/2008 | West | ............................ | 313/506 |

(Continued)

FOREIGN PATENT DOCUMENTS
JP       3703028 B2    4/2004
(Continued)

OTHER PUBLICATIONS

Alongkarn Chutinan, et al., "Theoretical analysis on light-extraction efficiency of organic light-emitting diodes using FDTD and mode-expansion methods", Organic Electronics, vol. 6, 2005, pp. 3-9.

(Continued)

*Primary Examiner* — Bumsuk Won
(74) *Attorney, Agent, or Firm* — Sughrue Mion, PLLC

(57) ABSTRACT

The present invention is intended to evaluate outgoing light from a light emitting device including a structure in which four or more layers of thin films, including a light-emitting layer, are laminated, in a shorter period of computation time, as compared with conventional methods. An evaluation method for the device layer structure design of a light emitting device is a method for evaluating outgoing light from a light emitting device including a structure in which four or more layers of thin films, including a light-emitting layer, are laminated, using an information processing apparatus, the method including: an input step (S01) of inputting parameters of the thin films constituting the light emitting device and information indicating a spectrum of light emitted from the light-emitting layer; a spectrum calculation step (S03) of generating information based on the parameters input in the input step and indicating the light emitting device divided into meshes only in the lamination direction of the thin films, and calculating a spectrum of outgoing light from the light emitting device by an FDTD method using the generated information and the information indicating the spectrum of the light emitted from the light-emitting layer; and a spectrum information output step (S03) of outputting information indicating the calculated spectrum of outgoing light.

5 Claims, 15 Drawing Sheets

U.S. PATENT DOCUMENTS

| | | | | |
|---|---|---|---|---|
| 7,462,984 | B2* | 12/2008 | Handa et al. | 313/503 |
| 2007/0120136 | A1 | 5/2007 | Noda et al. | |
| 2008/0034866 | A1* | 2/2008 | Kilic et al. | 73/514.26 |
| 2009/0268205 | A1* | 10/2009 | Naya | 356/445 |
| 2009/0323014 | A1* | 12/2009 | Cunningham et al. | 351/44 |

FOREIGN PATENT DOCUMENTS

| | | |
|---|---|---|
| JP | 2004-165154 A | 6/2004 |
| JP | 2004-311419 A | 11/2004 |
| JP | 2005-523495 A | 8/2005 |
| JP | 2005-251525 A | 9/2005 |
| JP | 2006-040784 A | 2/2006 |
| JP | 2006-278035 A | 10/2006 |

OTHER PUBLICATIONS

S. F. Yu, "Dynamic Behavior of Vertical-Cavity Surface-Emitting Lasers", IEEE Journal of Quantum Electronics, vol. 32, No. 7, Jul. 1996, pp. 1168-1179.

Norika Watari, et al., "Optical Design that Increases Light-Extraction Efficiencies of Organic Light-Emitting Devices through Finite-Difference-Time-Domain Method", Japanese Journal of Applied Physics, vol. 43, No. 10, 2004, pp. 7010-7014.

Tohru Uno, "Finite Difference Time Domain Method for Electromagnetic Field and Antennas", Corona Publishing Co., Ltd., Mar. 1998, pp. 1-33, 60-69, and 192-203.

* cited by examiner

Fig.12

| | Ca | |
|---|---|---|
| $a_j$ | $\omega_j^{Drp}$ | $\omega_j^{Drt}$ |
| 13.7806 | 1.6151 | 0.1921 |
| -0.5733 | 0.7713 | 5.9677 |
| 3.6109 | -3.2211 | 15.8188 |
| -3.1914 | 3.0144 | 4.923 |
| -5.0711 | -0.0358 | 6.9045 |
| -2.8278 | 0.3781 | 14.8881 |
| 1.498 | 0.6772 | 2.2389 |
| -7.1741 | 0.2227 | 6.9201 |
| 9.2738 | 2.7855 | 15.9121 |
| 6.2238 | -0.1217 | 1.6196 |
| 9.4183 | -0.0822 | 8.1466 |
| -4.956 | 0.0554 | 1.6357 |
| -0.0449 | -0.0562 | 4.7166 |
| -9.998 | 0.6459 | 0.2878 |
| 15.6496 | 0.5391 | 0.0031 |

*Fig.13*

| A1 | | |
|---|---|---|
| $a_j$ | $\omega_j^{Drp}$ | $\omega_j^{Drt}$ |
| 6.2545 | 4.8289 | 0.3401 |
| -0.5792 | -10 | 0.2399 |
| 16.2137 | 2.6974 | 1.3372 |

Fig.15

|  | LIGHT-EMITTING LAYER THICKNESS (nm) | | |
|---|---|---|---|
|  | 30 | 40 | 50 |
| PEDOT LAYER THICKNESS (nm) 70 | 7.58 | 10.0 | 10.6 |
| 80 | 9.59 | 10.9 | 7.86 |
| 90 | 9.27 | 7.42 | 6.12 |
| 100 | 7.10 | 6.35 | 4.84 |

EVALUATION METHOD OF DEVICE LAYER STRUCTURE DESIGN FOR LIGHT EMITTING DEVICE, EVALUATION APPARATUS AND LIGHT EMITTING DEVICE

TECHNICAL FIELD

The present invention relates to an evaluation method for the device layer structure design of a light emitting device for evaluating outgoing light from the light emitting device including a structure in which thin films are laminated, an evaluation apparatus, and the light emitting device.

BACKGROUND ART

In general, in a light emitting device in which thin films are laminated, such as an inorganic EL (Electroluminescent) light emitting device or an organic EL light emitting device, it is necessary to enhance the chromatic purity of light emission and the efficiency of light extraction. Accordingly, a resonator structure is introduced to the light emitting device, in order to improve the chromatic purity and the light extraction efficiency.

In the light emitting device to which a resonator structure has been introduced, it is important for light emitted by a light-emitting layer and the reflected light of that light within the structure of the light emitting device to effectively interfere with each other. Structure design has therefore been an important object. Initially, in this design of a device structure, effects of multiple reflection in a boundary face of a multilayer film were not taken into consideration. Therefore, it has not always been possible to say that a designed device structure is optimum (see, for example, Patent Documents 1 and 2). In contrast, there has been made analyses using a finite difference time domain method (FDTD method) which is a method of electromagnetic wave analysis in which multiple reflection in a boundary face of a multilayer film can be taken into consideration (see, for example, Non-Patent Document 1).

Patent Document 1: Japanese Patent Laid-Open No. 2004-165154
Patent Document 2: Japanese Patent No. 3703028
Non-Patent Document 1: A. Chutinan, et al., Org. Elec. vol. 6 p. 3, 2005

DISCLOSURE OF THE INVENTION

Problem to be Solved by the Invention

However, since a light emitting device is divided into spatial meshes in a two- or three-dimensional space in the method described in Non-Patent Document 1, the number of meshes to be used for calculation becomes enormous when the method is used in the structure design of a light emitting device comprised of four or more layers of multilayer thin films. It has therefore been difficult to make designs in a realistic computation time using this method. Accordingly, there have not been known any light emitting devices having an optimum resonator structure available by means of design using this method and comprised of four or more layers of multilayer thin films.

The present invention has been accomplished in order to solve the above-described problems. Accordingly, an object of the present invention is to provide an evaluation method and an evaluation apparatus for the device layer structure design of a light emitting device which enables outgoing light from the light emitting device including a structure in which four or more layers of thin films, including a light-emitting layer, are laminated, to be evaluated in a shorter period of computation time, as compared with conventional methods. Another object of the present invention is to provide a light emitting device having a functionally preferred device structure by setting a value based on information output by the aforementioned evaluation method to within a specific range. Note that the four or more layers of thin films as referred to herein do not include a thin film to serve as an electrode. That is, if the four or more layers of thin films are defined as including a thin film to serve as an electrode, then the light emitting device includes a structure in which five or more layers of thin films are laminated.

Means for Solving the Problem

As a result of keen study to solve the above-described problems, the inventor of the application concerned has discovered that it is only the light traveling in the lamination direction of the light emitting device for which the interference of light related to outgoing light from a light emitting device takes place. On the basis of the knowledge thus gained, the inventor of the application concerned has discovered that it is possible to evaluate outgoing light also for a light emitting device including a structure in which four or more layers of multilayer thin films are laminated, by solving the propagation of light only in that direction using an FDTD method. This discovery has led the inventor to accomplish the present invention.

An evaluation method for the device layer structure design of a light emitting device in accordance with the present invention is a method for evaluating outgoing light from a light emitting device including a structure in which four or more layers of thin films, including a light-emitting layer, are laminated, using an information processing apparatus, the method being characterized by including: an input step of inputting parameters of the thin films constituting the light emitting device and information indicating a spectrum of light emitted from the light-emitting layer; a spectrum calculation step of generating information based on the parameters input in the input step and indicating the light emitting device divided into meshes only in the lamination direction of the thin films, and calculating a spectrum of outgoing light from the light emitting device by an FDTD method using the generated information and the information indicating the spectrum of the light emitted from the light-emitting layer input in the input step; and a spectrum information output step of outputting information indicating the spectrum of outgoing light from the light-emitting device calculated in the spectrum calculation step.

In a method for evaluating the device layer structure design of a light emitting device in accordance with the present invention, a spectrum of outgoing light from a light emitting device is calculated by an FDTD method using information indicating the light emitting device divided into meshes only in the lamination direction of thin films. According to the aforementioned method, effects of multiple reflection in a boundary face of a multilayer film can be taken into consideration since light propagation is precisely solved. In addition, in the evaluation method for the device layer structure design of a light emitting device in accordance with the present invention, mesh division (setting) is performed only in the lamination direction of thin films. Consequently, the number of meshes is greatly reduced, as compared with a conventional FDTD method in which two- or three-dimensional meshes are set. As a result, it is possible to evaluate outgoing light from a light emitting device including a structure, in which four or more layers of multilayer thin films are laminated, in a shorter period of computation time, as compared with conventional methods.

Parameters of the thin films preferably include the thicknesses and the refractive indexes of the thin films. According to this configuration, it is possible to reliably evaluate the outgoing light from the light emitting device.

The evaluation method for the device layer structure design of a light emitting device in accordance with the present invention preferably further includes a parameter output step of determining whether or not information indicating a spectrum of outgoing light from each light emitting device output in the spectrum information output step as the result that parameters of the thin films associated with a plurality of light emitting devices are input in the input step satisfies previously-set predetermined conditions, and outputting parameters of the thin films input in the input step for a light emitting device associated with information indicating the spectrum of the outgoing light that has been determined as satisfying the conditions. According to this configuration, it is possible to design a light emitting device having desired performance and including a structure in which four or more layers of multilayer thin films are laminated.

The previously-set predetermined conditions are preferably such that the value of a ratio of strength at the peak frequency of the spectrum of the outgoing light to strength at the peak frequency of the spectrum of light emitted from the light-emitting layer is a predetermined threshold value or larger. According to this configuration, it is possible to appropriately and reliably design a light emitting device.

Incidentally, as discussed above, the present invention can be described as an invention of an evaluation method for the device layer structure design of a light emitting device. In addition, as discussed below, the present invention can also be described as an invention of an evaluation apparatus for the device layer structure design of a light emitting device. This means that the inventions only differ in category and are therefore substantially the same, thus having the same action and effect.

That is, an evaluation apparatus for the device layer structure design of a light emitting device in accordance with the present invention is an apparatus for evaluating outgoing light from a light emitting device including a structure in which four or more layers of thin films, including a light-emitting layer, are laminated, the evaluation apparatus being characterized by comprising: input means for inputting parameters of the thin films constituting the light emitting device and information indicating a spectrum of light emitted from the light-emitting layer; spectrum calculation means for generating information based on the parameters input by the input means and indicating the light emitting device divided into meshes only in the lamination direction of the thin films and calculating a spectrum of outgoing light from the light emitting device by an FDTD method using the generated information and the information indicating the spectrum of the light emitted from the light-emitting layer input by the input means; and spectrum information output means for outputting information indicating the spectrum of outgoing light from the light-emitting device calculated by the spectrum calculation means.

The light emitting device in accordance with the present invention is characterized in that the value of a ratio of the strength of a spectrum of the outgoing light at the peak frequency thereof indicated by information evaluated and output by an evaluation method for the device layer structure design of the light emitting device to the strength of a spectrum of light emitted from the light-emitting layer at the peak frequency thereof is 6.5 or larger. The aforementioned light emitting device is sufficiently high in the strength of a spectrum of outgoing light at the peak frequency thereof and, therefore, can be a light emitting device having a functionally preferred device structure.

Effect of the Invention

In the present invention, since mesh division is performed only in the lamination direction of thin films, the number of meshes is greatly reduced, as compared with a conventional FDTD method in which two- or three-dimensional meshes are set. Consequently, according to the present invention, it is possible to evaluate outgoing light from a light emitting device including a structure, in which four or more layers of multilayer thin films are laminated, in a shorter period of computation time, as compared with conventional methods. In addition, by setting a value based on information output by the evaluation method to within a specific range, it is possible to provide a light emitting device having a functionally preferred device structure.

BRIEF DESCRIPTION OF THE DRAWINGS

FIG. 12 is a table of parameters used to calculate the dielectric constant of a Ca layer used in an example of the present invention;

FIG. 13 is a table of parameters used to calculate the dielectric constant of an Al metal used in an example of the present invention;

FIG. 15 is a table showing values of peak resonance ratios calculated by an example of the present invention according to a change in the thicknesses of a light-emitting layer and a PEDOT layer.

DESCRIPTION OF SYMBOLS

Figure 1:
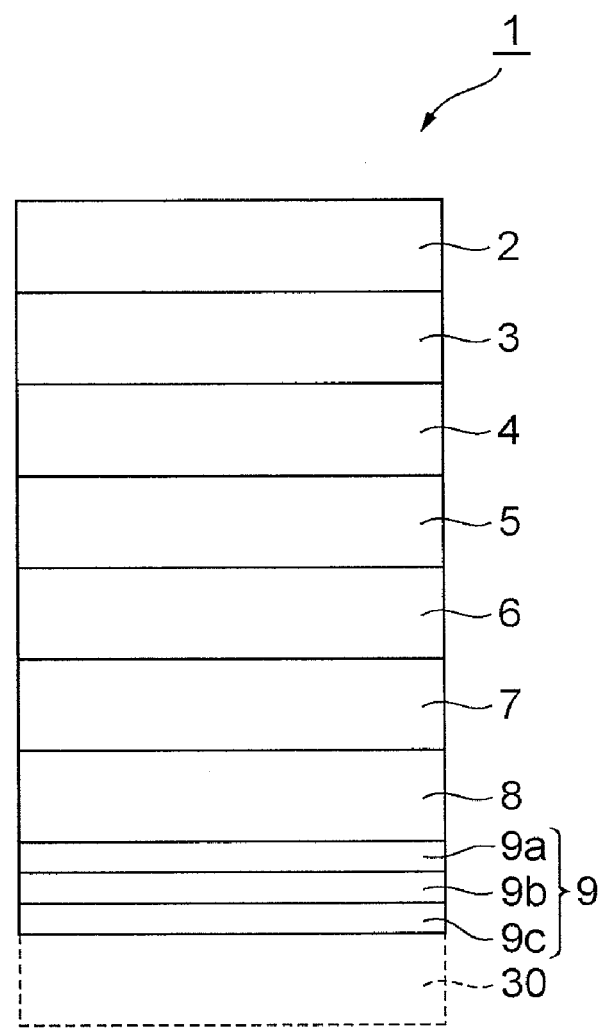
FIG. 1 is a drawing illustrating a configuration of a light emitting device to be evaluated by an evaluation method for the device layer structure design of a light emitting device in accordance with an embodiment of the present invention.

1 . . . Light emitting device, 10 . . . Evaluation apparatus, 11 . . . Input section, 12 . . . Spectrum calculation section, 13 . . . Peak resonance ratio calculation section, 14 . . . Output section, 20 . . . External apparatus.

BEST MODES FOR CARRYING OUT THE INVENTION

Hereinafter, preferred embodiments of an evaluation method and an evaluation apparatus for the device layer structure design of a light emitting device in accordance with the present invention will be described in detail along with drawings. Note that in the explanation of the drawings, the same constituent parts are denoted by the same numerals and will not be further explained. Also note that the dimensional ratio of a drawing does not necessarily agree with that of the drawing being explained.

An evaluation method for the device layer structure design of a light emitting device in accordance with the present embodiment is intended to evaluate outgoing light (extracted light) from a light emitting device including a structure in which four or more layers of thin films, including a light-emitting layer, are laminated. Specifically, a spectrum of outgoing light from the light emitting device is calculated using an FDTD method. Alternatively, the light emitting device may be designed using the above-described evaluation method for the device layer structure design of a light emitting device. This will be described later in more detail.

FIG. 1 illustrates an example of a light emitting device to be evaluated by an evaluation method for the device layer structure design of a light emitting device in accordance with the present embodiment. As illustrated in FIG. 1, a light emitting device 1 includes a structure in which a plurality of thin films 2 to 9 is laminated. More specifically, the light emitting device 1 is structured in the manner that an electrode 9, a light-emitting layer 8, a PEDOT layer 7, an ITO layer 6, a $TiO_2$ layer 5, an $SiO_2$ layer 4, a $TiO_2$ layer 3, and a glass substrate 2 as a light output medium are laminated in order on and above an air layer 30. Here, the electrode 9 is formed of an Al metal 9c, a Ca layer 9b and an LiF layer 9a laminated in order from the bottom. Of the above-described respective layers, the thin films 2 to 9 are approximately several tens of nanometers to several hundreds of nanometers in thickness. Note that a light emitting device to be evaluated by the evaluation method for the device layer structure design of a light emitting device in accordance with the present embodiment is not limited to the above-described example. Any light emitting devices are acceptable as long as the devices include a structure in which four or more layers of thin films, including a light-emitting layer, are laminated. Although the above-described light emitting device 1 has a configuration in which seven layers of the thin films 2 to 8 are included except the electrode 9, a light emitting device including, for example, 4 to 6 layers or eight or more layers of thin films may be used as an object of evaluation. In addition, the light emitting device 1 to be evaluated may include a metal portion, but is not limited to a light emitting device including a metal portion.

Figure 2:
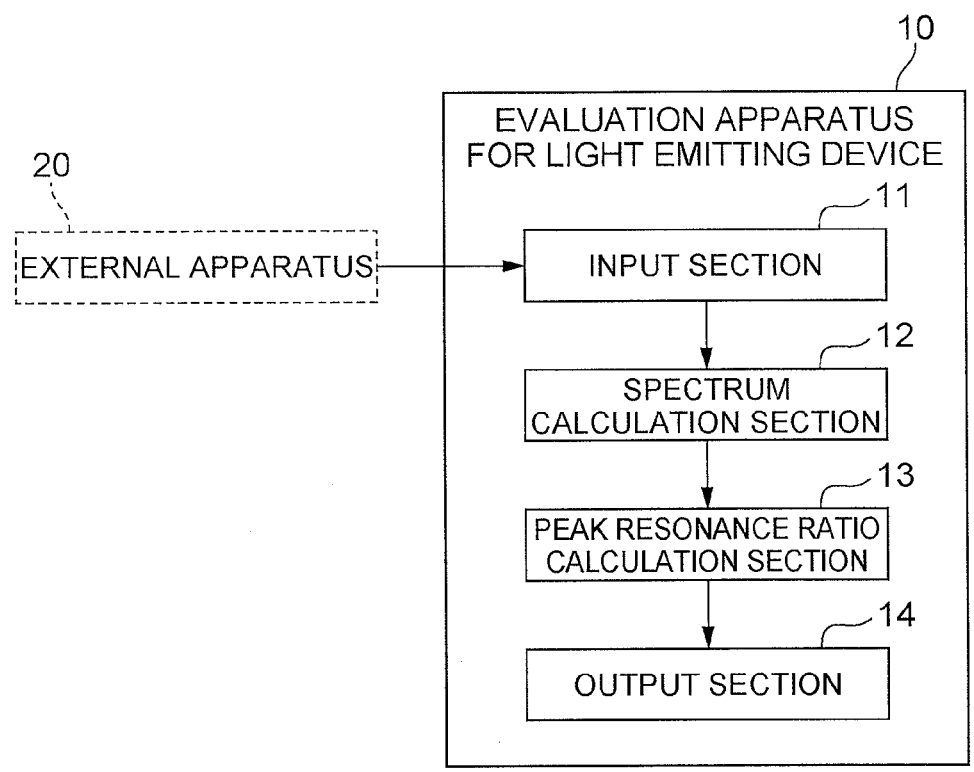
FIG. 2 is a configuration diagram illustrating an evaluation apparatus for the device layer structure design of a light emitting device in accordance with an embodiment of the present invention.

FIG. 2 illustrates an evaluation apparatus 10 for the device layer structure design of a light emitting device in which an evaluation method for the device layer structure design of the light emitting device in accordance with the present embodiment is carried out. The evaluation apparatus 10 for the device layer structure design of a light emitting device is specifically an information processing apparatus, such as a workstation or a PC (Personal Computer). The evaluation apparatus 10 for the device layer structure design of a light emitting device is comprised of hardware, such as a CPU (Central Processing Unit) and a memory. As the result of these components being put into operation, the evaluation apparatus 10 for the device layer structure design of a light emitting device exercises later-described functions that the apparatus has. Note that the present method may also be carried out as the result that a program for causing the evaluation method for the device layer structure design of a light emitting device in accordance with the present embodiment to be carried out for the information processing apparatus is executed on the evaluation apparatus 10 for the device layer structure design of the light emitting device.

As illustrated in FIG. 1, the evaluation apparatus 10 for the device layer structure design of a light emitting device is comprised of an input section 11, a spectrum calculation section 12, a peak resonance ratio calculation section 13, and an output section 14. In addition, the evaluation apparatus 10 for the device layer structure design of a light emitting device is connected to an external apparatus 20, from which information is input to the evaluation apparatus 10.

The input section 11 is input means for inputting parameters of the thin films 2 to 9 (and the air layer 30) constituting the light emitting device 1 and information indicating a spectrum of light emitted from the light-emitting layer 8. These items of information are necessary for calculations based on an FDTD method. The parameters of the thin films 2 to 9 to be input are specifically, for example, items of information indicating the thickness of each of the thin films 2 to 9, the order in which the thin films 2 to 9 are arranged, and the material of each of the thin films 2 to 9 (a refractive index, such as a birefringence "n" ($n^2$ in the case of a dielectric constant), and a magnetic permeability $\mu$). The information indicating a spectrum of light emitted from the light-emitting layer 7 is specifically, for example, information indicating a wavelength $\lambda$ in vacuum of the emitted light, an amplitude A of a location of emission, and an initial phase $\phi$. In addition, the information that the input section 11 inputs also include information used for calculations based on an FDTD method. Specifically, examples of the information include a spatial mesh width $\Delta h$, a time increment $\Delta t$, a time used to make initial calculations $T_{ini}$, and an end-of-calculation time $T_{max}$.

When a plurality of light emitting devices 1 is evaluated on the basis of a plurality of different parameters in order to design a light emitting device 1, the input section 11 inputs the plurality of parameters. In this case, the plurality of parameters themselves need not necessarily be input, but information indicating how to change the parameters may be input. For example, there may be input information indicating the thin films 2 to 9 to be varied in thickness and information indicating a span and a range over which the thickness is varied.

Note that there is no need to vary all of the parameters of the thin films 2 to 9. Only the parameters of specific thin films, among the thin films 2 to 9, which are deeply related to the performance of the light emitting device 1 may be varied. For example, it is preferable to vary the thicknesses of specific two or three layers of thin films, among the thin films 2 to 9, independently of one another. In addition, the way a layer thickness is varied may be such that the thickness is first varied coarsely, and then a portion high in peak resonance ratio to be described later may be varied finely. Furthermore, the layer structure of the light emitting device 1 may be fixed, and then the refractive indexes of a plurality of thin films, among the thin films 2 to 9, may be varied in the same way as the layer thickness.

Input of these items of information is specifically performed by, for example, accepting information input from the external apparatus 20 according to operation by a user. Alternatively, parameters input from the external apparatus 20 may be previously stored in the evaluation apparatus 10 for the device layer structure design of a light emitting device. Then, the stored parameters may be input using operation by the user as a trigger. The input section 11 outputs the input information to the spectrum calculation section 12.

The spectrum calculation section 12 is spectrum calculation means for solving Maxwell equations using an FDTD method on the basis of parameters input from the input section 11 and indicating the light emitting device 1, thereby calculating a spectrum of outgoing light from the light emitting device 1. Specifically, the spectrum calculation section 12 first generates information (model) indicating the light emitting device 1 divided into meshes only in the lamination direction (z-axis direction) of the thin films 2 to 9 and used to make calculations using an FDTD method based on parameters input from the input section 11 and indicating the light emitting device 1. Note that the term "meshes" as used herein refers to spatial meshes (space meshes). Also note that a spectrum of light emitted at the site of emission (light-emitting layer 7) is a spectrum in which interference due to the structure of the light emitting device 1 is ruled out. Therefore, in an actual device, the spectrum is the same as a spectrum going out in a direction perpendicular to the lamination direction of the light emitting device 1. In addition, each of the layers 2 to 9 of the light emitting device 1 forming a multilayer structure is approximately several tens to several hundreds of nanometers in thickness, as described above. Therefore, the size of meshes set here is several nanometers at the largest.

Subsequently, the spectrum calculation section 12 calculates the spectrum of outgoing light from the light emitting device 1 by an FDTD method using the generated information and information indicating a spectrum of light emitted from the light-emitting layer 7 input from the input section 11.

The spectrum calculation section 12 calculates an electric field and a magnetic field at each time and each position, the energy of light at each time and each position, a pointing vector at each time and each position, an integrated pointing vector at each position, and the like, by the above-described calculation performed on the light emitting device 1 (information indicating the device). The spectrum calculation section 12 calculates a spectrum of outgoing light (frequency and strength distributions) at a light output portion (specifically, for example, the leading end of the glass substrate 2 as a light output medium) of the light emitting device 1 on the basis of these items of information. The contents of calculation of the spectrum of outgoing light will be described in more detail later. Note that the spectrum calculation section 12 previously stores information, such as algorithms and known numerical values, used to make calculations based on an FDTD method and makes calculations by reading out the information. The spectrum calculation section 12 outputs information indicating the calculated spectrum to the peak resonance ratio calculation section 13. That is, the spectrum calculation section 12 serves also as spectrum information output means for outputting information indicating the calculated spectrum.

The peak resonance ratio calculation section 13 is means for calculating the peak resonance ratio "Z" of a light emitting device 1 to be evaluated. The peak resonance ratio "Z" refers to the value of a ratio of the strength "Ip" of a spectrum of outgoing light at the peak frequency thereof calculated by the spectrum calculation section 12 to the strength "I0" of a spectrum of light emitted from the light-emitting layer 8 at the peak frequency thereof (Z=Ip/I0). That is, the peak resonance ratio calculation section 13 is one function of parameter output means to be described later. The peak resonance ratio calculation section 13 outputs information indicating the calculated peak resonance ratio "Z" to the output section 14. Note that a larger value of the peak resonance ratio "Z" indicates that the performance of the light emitting device 1 is higher.

The output section 14 is parameter output means for determining whether or not information indicating a spectrum of outgoing light from each light emitting device 1 calculated and output by the spectrum calculation section 12 satisfies a predetermined condition, and outputting parameters of the thin films of a light emitting device 1 associated with information indicating the spectrum of the outgoing light determined as satisfying the condition. Here, the predetermined condition, for example, is that the above-described peak resonance ratio "Z" is a predetermined threshold value or larger. This condition is previously stored in the output section 14. The threshold value is preferably, for example, 5.7 or larger. In addition, a value of 6.0, 6.2 or 6.5 can be used as the threshold value.

The parameters of the thin films 2 to 9 of a light emitting device 1 to be output are those related to the structure of the light emitting device 1, such as the thicknesses of the thin films 2 to 9 and the like. The output section 14 obtains these parameters, as necessary, from the input section 11 or the like. Alternatively, at that time, the output section 14 may also output information indicating a spectrum of outgoing light from the light emitting device 1 calculated by the spectrum calculation section 12, information on the peak resonance ratio "Z", and the like. Output by the output section 14 is performed on, for example, a display unit or the like which the evaluation apparatus 10 for the device layer structure design of a light emitting device comprises. By referring to the output, a user can know the design information of a light emitting device 1 having predetermined performance. What has been described heretofore is the configuration of the evaluation apparatus 10 for the device layer structure design of a light emitting device.

Subsequently, using the flowcharts of FIGS. 3 to 6, a description will be given to an evaluation method for the device layer structure design of a light emitting device in accordance with the present embodiment based on the above-described evaluation apparatus 10 for the device layer structure design of a light emitting device.

Figure 3:
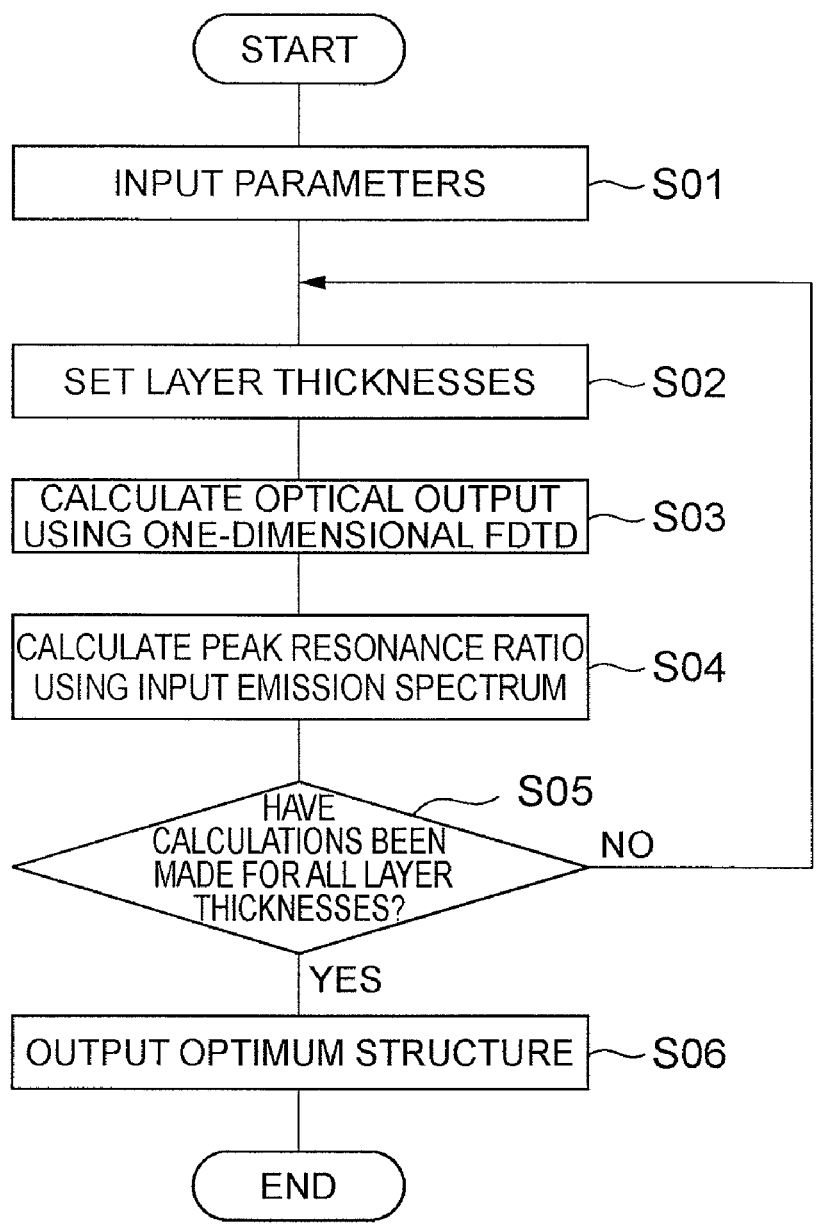
FIG. 3 is a flowchart illustrating an evaluation method for the device layer structure design of a light emitting device in accordance with an embodiment of the present invention.

In the evaluation apparatus 10 for the device layer structure design of a light emitting device, information, such as the above-described parameters and the like, necessary to evaluate the light emitting device 1 is first input by the input section 11 (S01 in FIG. 3, an input step). An evaluation is made of a plurality of light emitting devices 1, among those of the present embodiment, in which a change has been made to the thicknesses of the thin films 2 to 9 constituting the light emitting devices 1.

Then, information necessary to evaluate the light emitting devices 1 is output from the input section 11 to the spectrum calculation section 12. At that time, the thicknesses of the thin films 2 to 9 (layer thickness) are set in the input section 11 (S02, an input step). As the way the layer films are set, it is possible to use, for example, a method for varying a plurality of layer thicknesses by increments as described above, a method for varying the layer thicknesses based on random numbers, or the like.

Subsequently, a spectrum of outgoing light from the light emitting device 1 is calculated by the spectrum calculation section 12 using an FDTD method on the basis of information input from the input section 11 (S03, a spectrum calculation step). At this time, meshes to be set are divided only in the lamination direction (z-axis) of the thin films 2 to 8 of the light emitting device 1. That is, one-dimensional meshes are generated in the light emitting device 1. In other words, only the light traveling in one axial direction (z-axis) of a space is solved by a (one-dimensional) FDTD method. For the FDTD method, it is possible to use, for example, the method described in "Toru Uno, 'Finite Difference Time Domain Method for Electromagnetic Field and Antenna' Corona Publishing Co., Ltd. (1998)."

Figure 4:
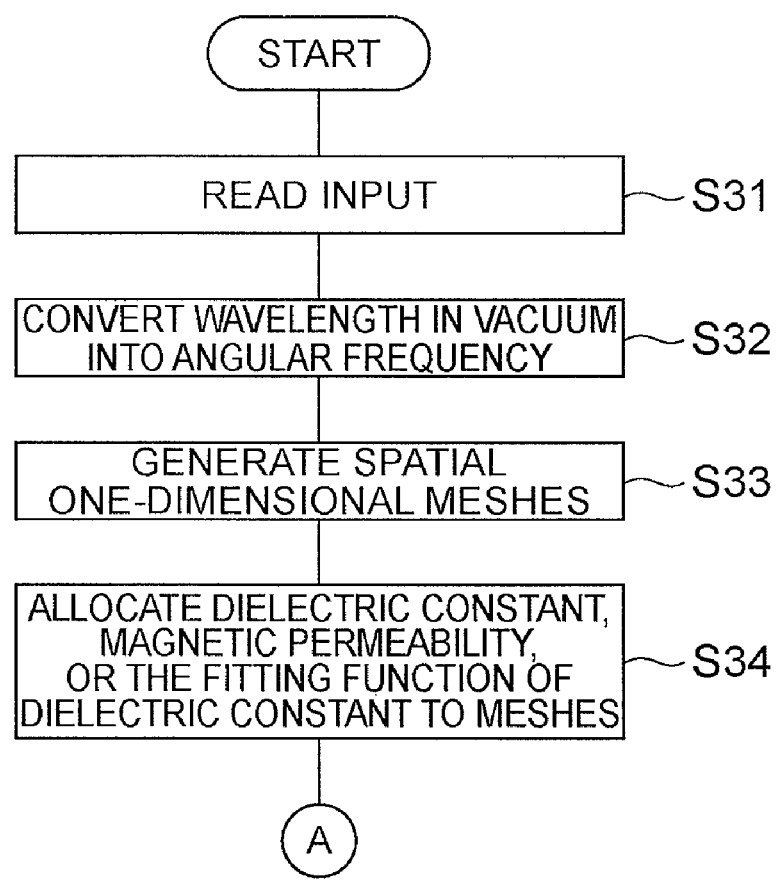
FIG. 4 is another flowchart illustrating an evaluation method for the device layer structure design of a light emitting device in accordance with an embodiment of the present invention.
Figure 5:
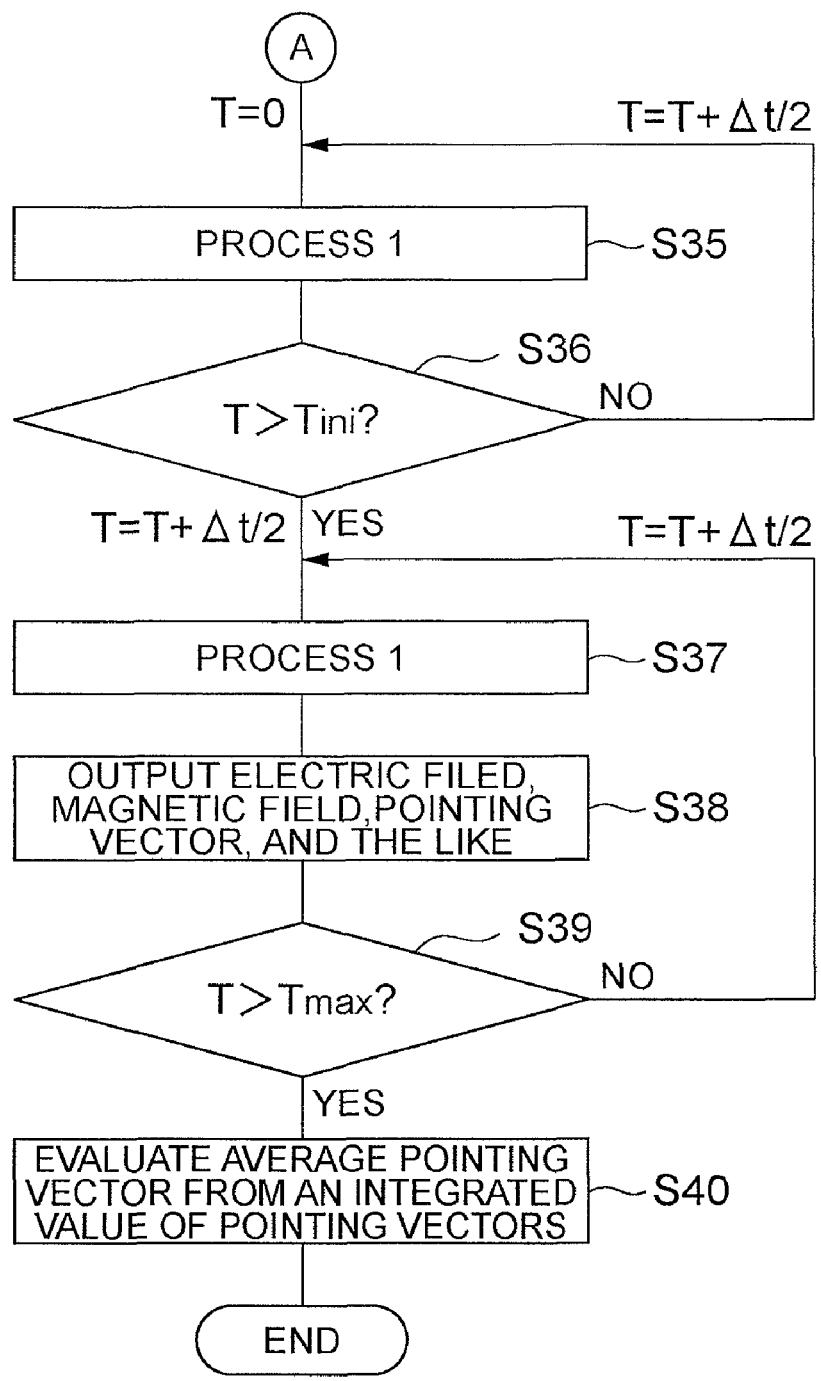
FIG. 5 is yet another flowchart illustrating an evaluation method for the device layer structure design of a light emitting device in accordance with an embodiment of the present invention.
Figure 6:
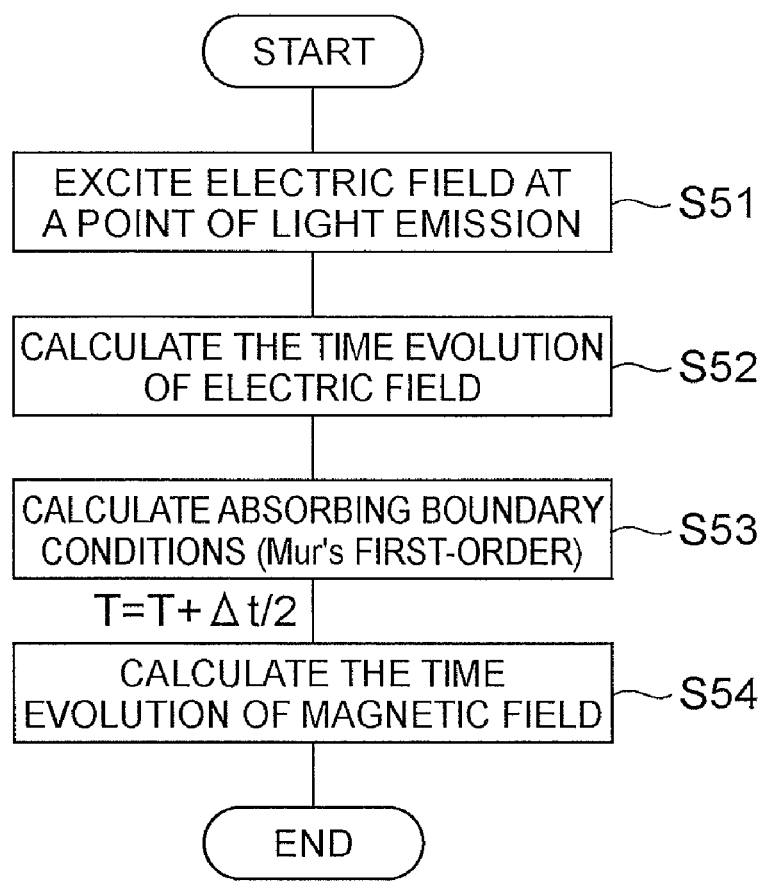
FIG. 6 is still another flowchart illustrating an evaluation method for the device layer structure design of a light emitting device in accordance with an embodiment of the present invention.
Figure 7:
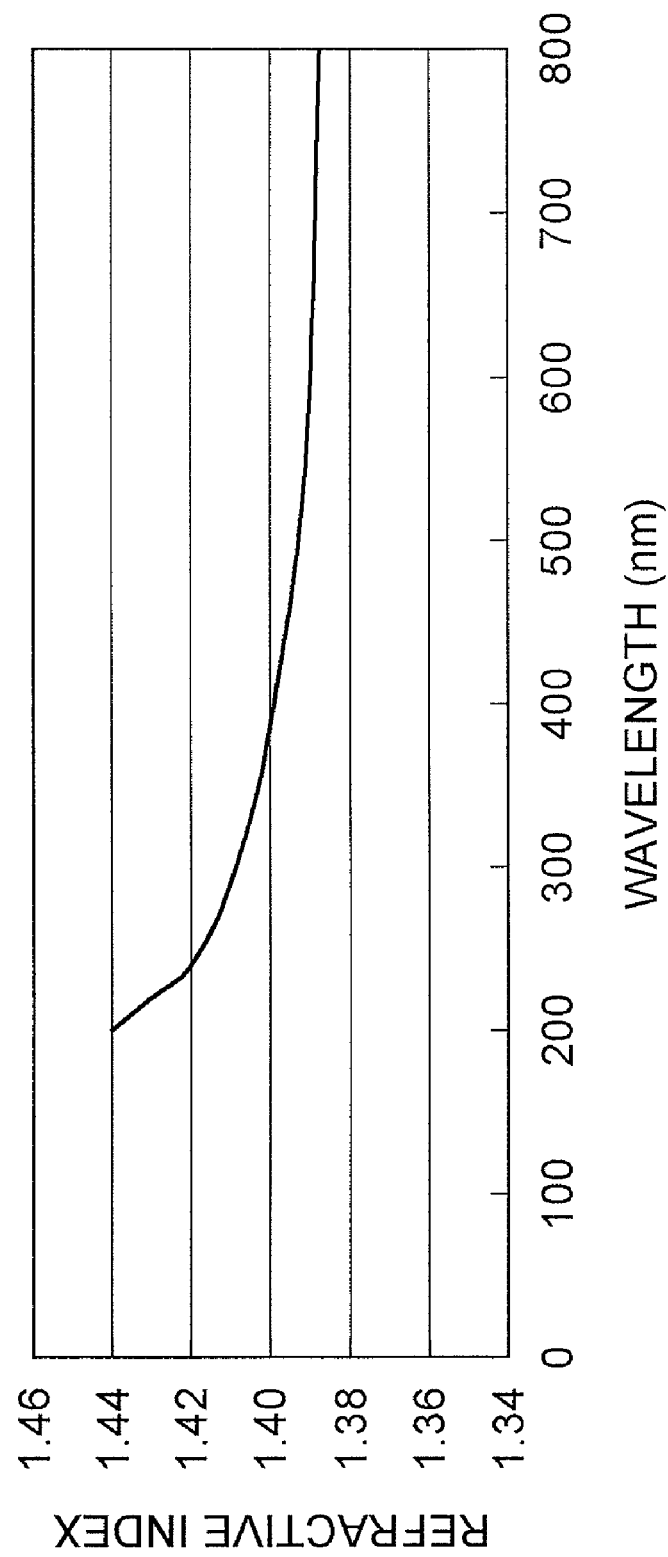
FIG. 7 is a graph illustrating a refractive index distribution of an LiF layer used in an example of the present invention.
Figure 8:
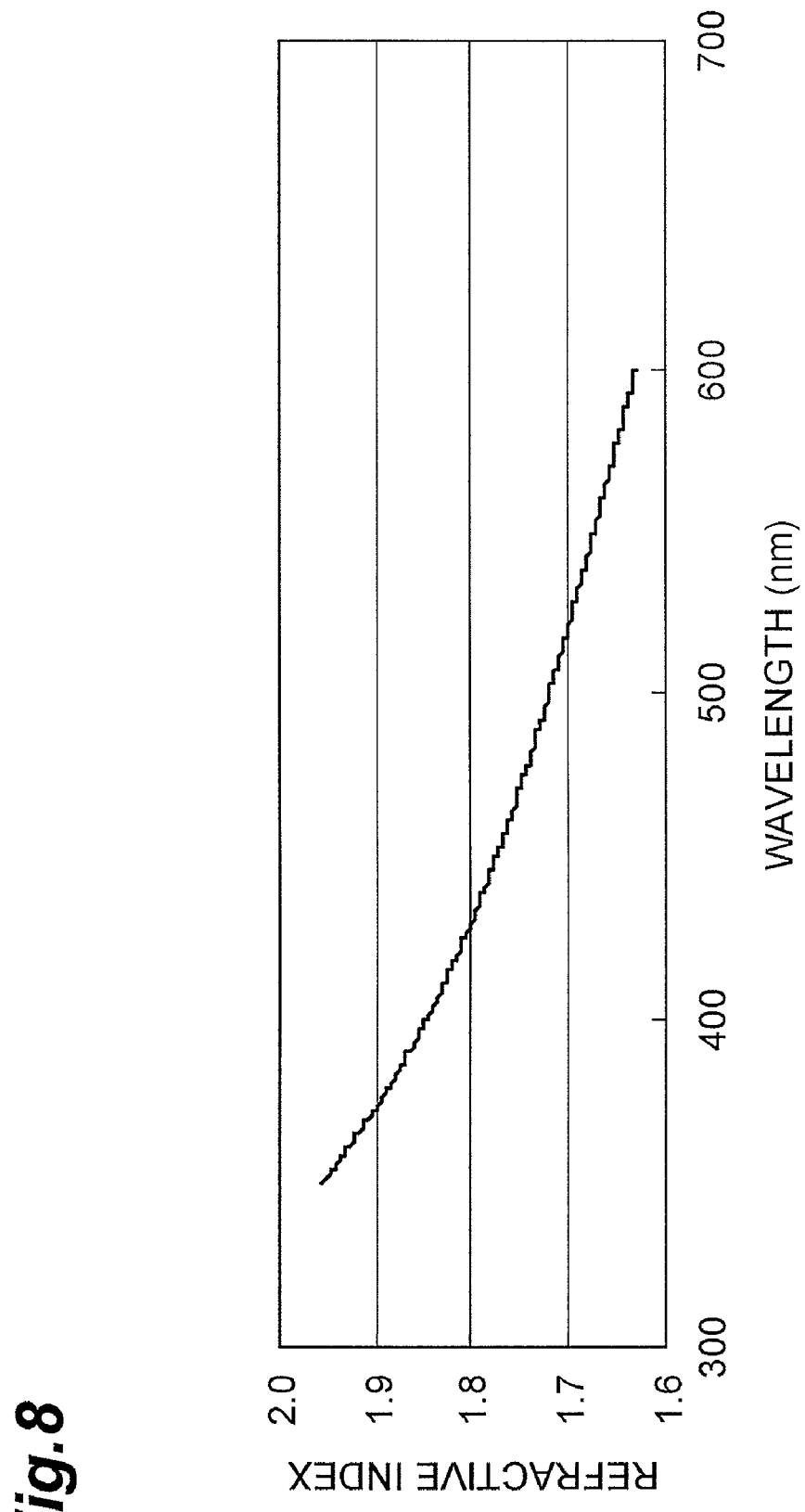
FIG. 8 is a graph illustrating a refractive index distribution of an ITO layer used in an example of the present invention.
Figure 9:
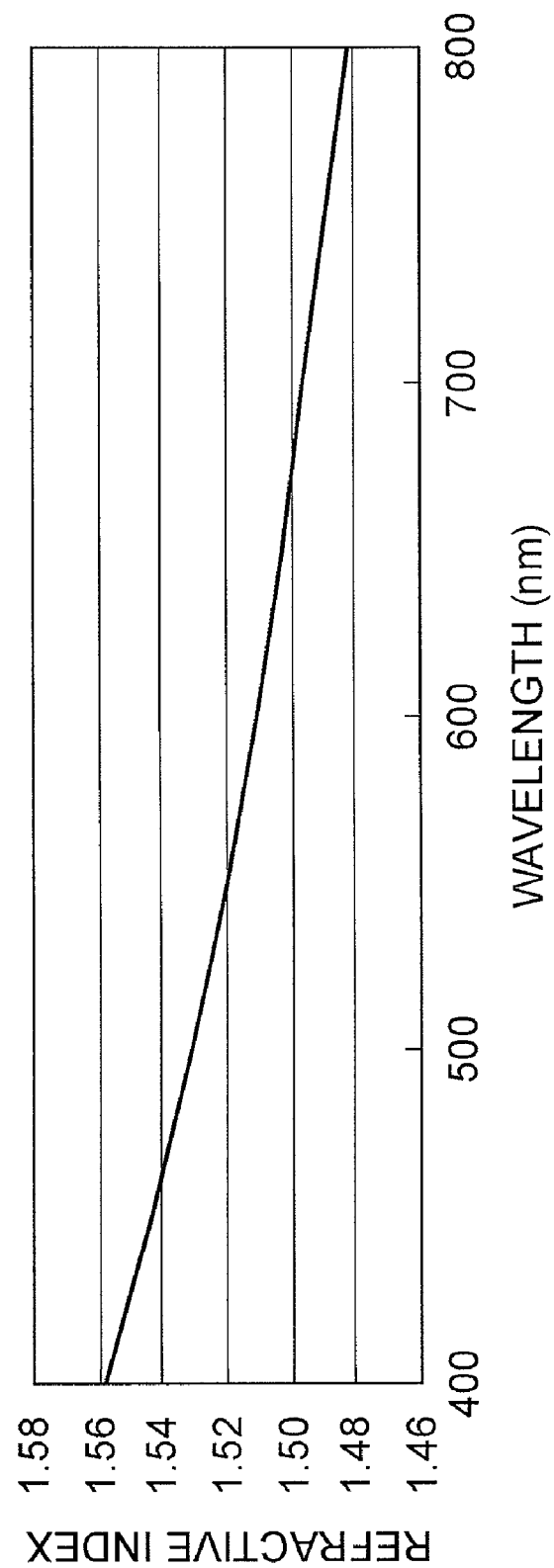
FIG. 9 is a graph illustrating a refractive index distribution of a PEDOT layer used in an example of the present invention.
Figure 10:
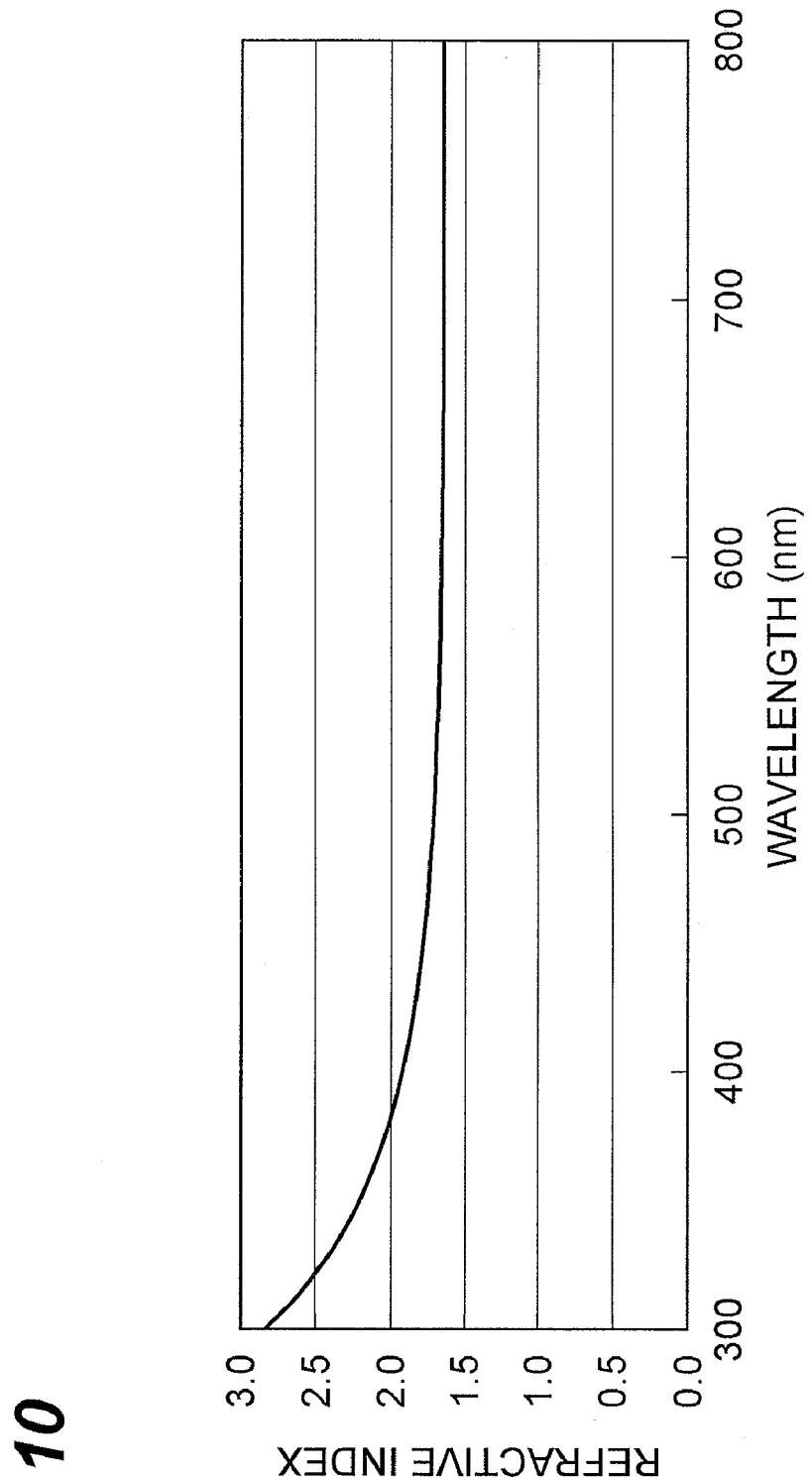
FIG. 10 is a graph illustrating a refractive index distribution of a light-emitting layer used in an example of the present invention.
Figure 11:
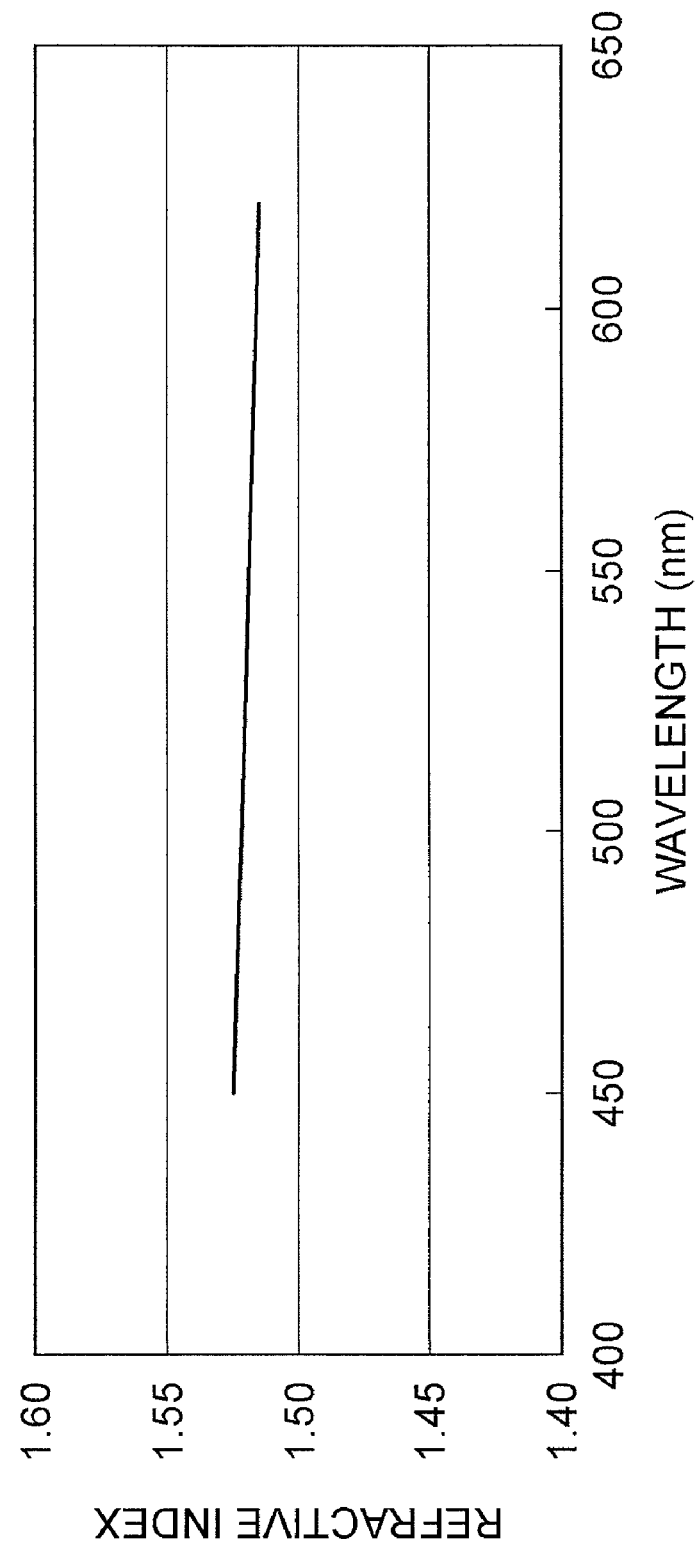
FIG. 11 is a graph illustrating a refractive index distribution of a glass substrate used in an example of the present invention.

Here, the calculation of a spectrum of outgoing light by the spectrum calculation section 12 using an FDTD method will be described in more detail using the flowcharts of FIGS. 4 to 6. First, information necessary to evaluate a light emitting device 1 is read (S31 in FIG. 4, a spectrum calculation step). Subsequently, a wavelength in vacuum is converted into an angular frequency (S32, a spectrum calculation step). Subsequently, one-dimensional meshes are generated in the light emitting device 1 indicated by parameters and the like input by the input section 11 (S33, a spectrum calculation step). The meshes are set in such a manner as described below.

Now assume that the traveling direction of light is the z-axis, as described above, a spatial mesh width is $\Delta h$, and a time increment is $\Delta t$. Layers are arranged in the z-axis direction. An electric field "E" and a magnetic field "H" are arranged in an alternate manner, temporally and spatially, according to the way of division into temporospatial meshes by an FDTD method. Consequently, the electric field is represented as $t=0, \Delta t, \ldots (n-1) \Delta t, n\Delta t, (n+1)\Delta t, \ldots$ and the magnetic field is represented as $t=\frac{1}{2}\Delta t, \frac{3}{2}\Delta t, \ldots (n-\frac{1}{2}) \Delta t, (n+\frac{1}{2}) \Delta t, (n+\frac{3}{2}) \Delta t, \ldots$, with respect to time (where, "n" is an integer and denotes the index of a temporal mesh). In addition, the electric field is represented as $z=0, \Delta h, \ldots (m-1) \Delta h, m\Delta h, (m+1) \Delta h, \ldots$ and the magnetic field is represented as $t=\frac{1}{2}\Delta h, \frac{3}{2}\Delta h, \ldots (m-\frac{1}{2}) \Delta h, (m+\frac{1}{2}) \Delta h, (m+\frac{3}{2}) \Delta h, \ldots$, with respect to position (where, "m" is an integer and denotes the index of a spatial mesh). The electric field and the magnetic field are represented as shown below for the "x" component and the "y" component thereof, respectively:

$$E_x^n(i), H_x^{n+\frac{1}{2}}\left(i+\frac{1}{2}\right) \quad \text{[Expression 1]}$$
$$E_y^n(i), H_y^{n+\frac{1}{2}}\left(i+\frac{1}{2}\right)$$

Subsequently, a dielectric constant, a magnetic permeability, or the fitting function of a dielectric constant is allocated to meshes (S34, a spectrum calculation step). Subsequently, a time step is set as T=0 and the following process (hereinafter referred to as a process 1) is performed (S35 in FIG. 5, a spectrum calculation step).

The process 1 will be described using the flowchart of FIG. 6. First, electric field excitation (light emission) at a point of emission "j" is evaluated by the following expression (S51, a spectrum calculation step).

$$E_x^{n-1}(j) = E_x^{n-1}(j) + A \sin(\omega(n-1)\Delta t + \phi) \quad \text{[Expression 2]}$$

where $\omega$ denotes the angular frequency of emitted light, $\phi$ denotes an initial phase, and "A" denotes an amplitude. The expression $\in(j)A^2$, in which $\in(j)$ to be described later is used, corresponds to energy.

Subsequently, the time evolution of an electric field is calculated (electric field updating) (S52, a spectrum calculation step). Updating of an electric field at a position "i" (on the z-axis) from an (n−1)th time step to an nth time step is performed according to the following expressions.

$$E_x^n(i) = A(i)\{E_x^{n-1}(i) + \Phi_{totDrx}^{n-1}(i) + \Phi_{totLzx}^{n-1}(i)\} + \quad \text{[Expression 3]}$$
$$B_x(i)\left\{H_y^{n-\frac{1}{2}}\left(i+\frac{1}{2}\right) - H_y^{n-\frac{1}{2}}\left(i-\frac{1}{2}\right)\right\}$$
$$E_y^n(i) = A(i)\{E_y^{n-1}(i) + \Phi_{totDry}^{n-1}(i) + \Phi_{totLzy}^{n-1}(i)\} +$$
$$B_y(i)\left\{H_x^{n-\frac{1}{2}}\left(i+\frac{1}{2}\right) - H_x^{n-\frac{1}{2}}\left(i-\frac{1}{2}\right)\right\}$$

Here, $A(i)$, $B_x(i)$, $B_y(i)$, $\phi_{totDrx}^{n-1}(i)$, $\phi_{totDry}^{n-1}(i)$, $\phi_{totLzx}^{n-1}(i)$ and $\phi_{totLzy}^{n-1}(i)$ are given by the following expressions, according to the respective cases described below.

(1) If the dielectric constant $\in$ of a substance located at a position "i" is given by $\in=\in_{re}+i\in_{im}$ (in this expression, "i" denotes an imaginary unit) and $\omega$ is assumed to be an angular frequency of light, then $$A(i) = \frac{\varepsilon_{re} - \frac{\varepsilon_{im}\omega\Delta t}{2}}{\varepsilon_{re} + \frac{\varepsilon_{im}\omega\Delta t}{2}}, \quad \text{[Expression 4]}$$

$$B_x(i) = -B_y(i) = -\frac{1}{\varepsilon_{re} + \frac{\varepsilon_{im}\omega\Delta t}{2}} \frac{\Delta t}{\Delta h}$$

$$\Phi_{totDrx}^{n-1}(i) = \Phi_{totDry}^{n-1}(i) = \Phi_{totLzx}^{n-1}(i) = \Phi_{totLzy}^{n-1}(i) = 0$$

hold true.

(2) If the dielectric constant $\in$ of the substance located at the position "i" is given by $$\varepsilon(\omega) = 1 + \sum_{j=1}^{k} a_j Dr_j(\omega) + \sum_{j=1}^{l} b_j Lz_j(\omega) \quad \text{[Expression 5]}$$

assuming that the angular frequency of light is $\omega$ (where, $$Dr_j(\omega) = -\frac{\left(\omega_j^{Drp}\right)^2}{\left(\omega_j^{Drt}\right)^2 + \omega^2} + i\frac{\left(\omega_j^{Drp}\right)^2 \omega_j^{Drt}}{\omega\{(\omega_j^{Drt})^2 + \omega^2\}} \quad \text{[Expression 6]}$$

$$Lz_j(\omega) = \frac{\left(\omega_j^{Lzp}\right)^2\{(\omega_j^{Lzp})^2 - \omega^2\}}{\{(\omega_j^{Lzp})^2 - \omega^2\}^2 + 4\omega^2(\omega_j^{Lzt})^2} +$$
$$i\frac{-2\omega\omega_j^{Lzt}(\omega_j^{Lzp})^2}{\{(\omega_j^{Lzp})^2 - \omega^2\}^2 + 4\omega^2(\omega_j^{Lzt})^2}$$

assuming that "i" is an imaginary unit) where $Dr_j$ and $Lz_j$ are Drude type and Lorenz type functions and $a_j$ and $b_j$ are expansion coefficients, $\omega_j^{Drp}$ and $\omega_j^{Lzp}$ are parameters corresponding to plasma frequencies, and $\omega_j^{Drt}$ and $\omega_j^{Lzt}$ are parameters corresponding to collision frequencies, then $$A(i) = \frac{1}{1 + \sum_{j=1}^{k} a_i \chi_j^{Dr0} + \sum_{j=1}^{l} b_i \chi_j^{Lz0}}$$

$$\Phi_{totDrx}^{n-1} = \sum_{j=1}^{k} \varphi_j^{Drx,n-1},$$

$$\Phi_{totDry}^{n-1} = \sum_{j=1}^{k} \varphi_j^{Dry,n-1},$$

$$\Phi_{totLzx}^{n-1} = \sum_{j=1}^{l} \varphi_j^{Lzx,n-1},$$

$$\Phi_{totLzy}^{n-1} = \sum_{j=1}^{l} \varphi_j^{Lzy,n-1}$$

$$B_x(i) =$$
$$-B_y(i) = -\frac{1}{\varepsilon_0 \left(1 + \sum_{j=1}^{k} a_i \chi_j^{Dr0} + \sum_{j=1}^{L} b_i \chi_j^{Lz0}\right)} \frac{\Delta t}{\Delta h}$$

[Expression 7]

hold true. Here, $\varepsilon_0$ is a dielectric constant in vacuum. $\chi_j^{Dr0}$, $\chi_j^{Lz0}$, $\phi^{Drx,n-1}$, $\phi^{Dry,n-1}$, $\phi^{Lzx,n-1}$ and $\phi^{Lzy,n-1}$ are represented by the following expressions.

$$\chi_j^{Dr0} = \left(\omega_j^{Drp}\right)^2 \omega_j^{Drt} \left\{\Delta t - \omega_j^{Drt}\left(1 - e^{-\frac{\Delta t}{\omega_j^{Drt}}}\right)\right\}$$

[Expression 8]

$$\chi_j^{Lz0} = \begin{cases} -\dfrac{2\bar{s}_{pj}(1 - e^{s_{pj}\Delta t})}{s_{pj} - \bar{s}_{pj}} & (\omega_j^{Lzp} > \omega_j^{Lzt}) \\ -\dfrac{(\omega_j^{Lzp})^2}{2\beta_j}\left(\dfrac{1 - e^{-(\omega_j^{Lzt}+\beta_j)\Delta t}}{\omega_j^{Lzt}+\beta_j} + i\dfrac{1 - e^{-(\omega_j^{Lzt}-\beta_j)\Delta t}}{\omega_j^{Lzt}-\beta_j}\right) & (\omega_j^{Lzp} < \omega_j^{Lzt}) \end{cases}$$

where $$s_{pj} = -\omega_j^{Lzt} + i\sqrt{\left(\omega_j^{Lzp}\right)^2 - \left(\omega_j^{Lzt}\right)^2}$$

$$\bar{s}_{pj} = -\omega_j^{Lzt} - i\sqrt{\left(\omega_j^{Lzp}\right)^2 - \left(\omega_j^{Lzt}\right)^2}$$

$$\beta_j = \sqrt{\left(\omega_j^{Lzt}\right)^2 - \left(\omega_j^{Lzp}\right)^2}$$

[Expression 9]

In addition, $$\varphi_j^{Drx,n-1} = a_j E_x^{n-1} \Delta \chi_j^{Dr0} + e^{-\frac{\Delta t}{\omega_j^{Drt}}} \varphi_n^{Drx,n-2}$$

$$\varphi_j^{Dry,n-1} = a_j E_y^{n-1} \Delta \chi_j^{Dr0} + e^{-\frac{\Delta t}{\omega_j^{Drt}}} \varphi_n^{Drx,n-2}$$

[Expression 10]

where $$\Delta \chi_j^{Dr0} = -\left\{\omega_j^{Drt} \omega_j^{Drp}\left(1 - e^{-\frac{\Delta t}{\omega_j^{Drt}}}\right)\right\}^2$$

$$\varphi_j^{Drx,-1} = \varphi_j^{Drx,0} = \varphi_j^{Dry,-1} = \varphi_j^{Dry,0} = 0$$

[Expression 11]

Furthermore, $$\varphi_j^{Lzx,n-1} = \text{Re}(\tilde{\varphi}_j^{Lzx,n-1}),\ \varphi_j^{Lzy,n-1} = \text{Re}(\tilde{\varphi}_j^{Lzy,n-1})$$

[Expression 12]

holds true and, if $\omega_j^{Lzp} > \omega_j^{Lzt}$, then $$\tilde{\varphi}_j^{Lzx,n-1} = b_j E_x^{n-1} \Delta \chi_j^{Lz0} + e^{s_p \Delta t} \tilde{\varphi}_j^{Lzx,n-2}$$

$$\tilde{\varphi}_j^{Lzy,n-1} = b_j E_y^{n-1} \Delta \chi_j^{Lz0} + e^{s_p \Delta t} \tilde{\varphi}_j^{Lzy,n-2}$$

hold true, where $$\Delta \chi_j^{Lz0} = -\frac{2\bar{s}_{pj}(1 - e^{s_{pj}\Delta t})^2}{s_{pj} - \bar{s}_{pj}}$$

$$\tilde{\varphi}_j^{Lzx,-1} = \tilde{\varphi}_j^{Lzx,0} = \tilde{\varphi}_j^{Lzy,-1} = \tilde{\varphi}_j^{Lzy,0} = 0$$

[Expression 13]

If $\omega_j^{Lzp} < \omega_j^{Lzt}$, then $$\tilde{\varphi}_j^{Lzx,n-1} =$$
$$b_j E_x^{n-1} \Delta \chi_j^{Lz0} + (e^{-(\omega_j^{Lzt}+\beta_j)\Delta t} + i e^{-(\omega_j^{Lzt}-\beta_j)\Delta t}) \tilde{\varphi}_j^{Lzx,n-1}$$

[Expression 14]

-continued $$\tilde{\varphi}_j^{Lzy,n-1} = b_j E_y^{n-1} \Delta \chi_j^{Lz0} +$$
$$(e^{(-\omega_j^{Lzt}+\beta_j)\Delta t} + i e^{-(\omega_j^{Lzt}-\beta_j)\Delta t}) \tilde{\varphi}_j^{Lzy,n-1}$$

hold true, where $$\Delta \chi_j^{Lz0} =$$
$$-\frac{(\tilde{\omega}_j^{Lzp})^2}{2\beta}\left[\frac{\left(1 - e^{-(\omega_j^{Lzt}+\beta_j)\Delta t}\right)^2}{\omega_j^{Lzt}+\beta_j} + i\frac{\left(1 - e^{-(\omega_j^{Lzt}-\beta_j)\Delta t}\right)^2}{\omega_j^{Lzt}-\beta_j}\right]$$

$$\tilde{\varphi}_j^{Lzx,-1} = \tilde{\varphi}_j^{Lzx,0} = \tilde{\varphi}_j^{Lzy,-1} = \tilde{\varphi}_j^{Lzy,0} = 0$$

[Expression 15]

Subsequently, such boundary conditions as shown below are set in electric fields at the first (j=0) and the last (j=mj) of meshes (Mur's first-order absorbing boundary conditions) (S53, a spectrum calculation step).

$$E_x^n(0) = E_x^{n-1}(1) + \frac{v_0 \Delta t - \Delta h}{v_0 \Delta t + \Delta h}(E_x^n(1) - E_x^{n-1}(0))$$ [Expression 16]

$$E_y^n(0) = E_y^{n-1}(1) + \frac{v_0 \Delta t - \Delta h}{v_0 \Delta t + \Delta h}(E_y^n(1) - E_y^{n-1}(0))$$

$$E_x^n(mj) = E_x^{n-1}(mj-1) + \frac{v_{mj} \Delta t - \Delta h}{v_{mj} \Delta t + \Delta h}(E_x^n(mj-1) - E_x^{n-1}(mj))$$

$$E_y^n(mj) = E_y^{n-1}(mj-1) + \frac{v_{mj} \Delta t - \Delta h}{v_{mj} \Delta t + \Delta h}(E_y^n(mj-1) - E_y^{n-1}(mj))$$

where $v_0$ and $v_{mj}$ are evaluated by the following expressions, assuming that the velocity of light in vacuum is "c", a refractive index allocated to the first mesh (j=0) is $n_0$, and a refractive index allocated to the last mesh (j=mj) is $n_{mj}$.

$$v_0 = \frac{c}{n_0}$$ [Expression 17]

$$v_{mj} = \frac{c}{n_{nj}}$$

Subsequently, a time step is set as T=T+Δt/2 and the time evolution of a magnetic field (electric field updating) is calculated (S54, a spectrum calculation step). A magnetic field at a position i+½ (on the z-axis) is updated from an (n−½)th time step to an (n+½)th time step according to the following expressions.

$$H_x^{n+\frac{1}{2}}\left(i+\frac{1}{2}\right) = C\left(i+\frac{1}{2}\right)H_x^{n-\frac{1}{2}}\left(i+\frac{1}{2}\right) + D_x\left(i+\frac{1}{2}\right)\{E_y^n(i+1) - E_y^n(i)\}$$ [Expression 18]

$$H_y^{n+\frac{1}{2}}\left(i+\frac{1}{2}\right) = C\left(i+\frac{1}{2}\right)H_y^{n-\frac{1}{2}}\left(i+\frac{1}{2}\right) + D_y\left(i+\frac{1}{2}\right)\{E_x^n(i+1) - E_x^n(i)\}$$

where C(i), $D_x$(i) and $D_y$(i) are given by the following expressions. Assuming that the magnetic permeability μ is defined as $\mu = \mu_{re} + i\mu_{im}$ (in this expression, "i" denotes an imaginary unit), then $$C(i) = \frac{\mu_{re} - \frac{\mu_{im} \omega \Delta t}{2}}{\mu_{re} + \frac{\mu_{im} \omega \Delta t}{2}},$$ [Expression 19]

$$D_x(i) = -D_y(i) = \frac{1}{\mu_{re} + \frac{\mu_{im} \omega \Delta t}{2}} \frac{\Delta t}{\Delta h}$$

hold true. What has been described heretofore is the process 1.

Subsequently, a determination is made whether or not T>$T_{ini}$ is satisfied (S36 in FIG. 5, a spectrum calculation step).

If a determination is made that T>$T_{ini}$ is not satisfied, then the time step is set as T=T+Δt/2 and the process 1 (S35) is performed once again.

If a determination is made that T>$T_{ini}$ is satisfied, then the time step is set as T=T+Δt/2 and the process 1 is performed (S37, a spectrum calculation step). Subsequently, an electric field, a magnetic field, a pointing vector, and the like are output (S38, a spectrum calculation step). Here, a pointing vector Sz at an observation point "k" is calculated by the following expression based on S=E×H.

$$S_z^n(k) = E_x^n(k)\left(\frac{H_y^{n+\frac{1}{2}}\left(k+\frac{1}{2}\right) + H_y^{n-\frac{1}{2}}\left(k+\frac{1}{2}\right) +}{4}\frac{H_y^{n+\frac{1}{2}}\left(k-\frac{1}{2}\right) + H_y^{n-\frac{1}{2}}\left(k-\frac{1}{2}\right)}{}\right) -$$ [Expression 20]

$$E_y^n(k)\left(\frac{H_x^{n+\frac{1}{2}}\left(k+\frac{1}{2}\right) + H_x^{n-\frac{1}{2}}\left(k+\frac{1}{2}\right) +}{4}\frac{H_x^{n+\frac{1}{2}}\left(k-\frac{1}{2}\right) + H_x^{n-\frac{1}{2}}\left(k-\frac{1}{2}\right)}{}\right)$$

Subsequently, a determination is made whether or not T>$T_{max}$ is satisfied (S39, a spectrum calculation step). If a determination is made that T>$T_{max}$ is not satisfied, then the time step is set as T=T+Δt/2 and the process 1 (S37) is performed once again. If a determination is made that T>$T_{max}$ is satisfied, then an average pointing vector is evaluated from the integrated value of pointing vectors (S40, a spectrum calculation step). Here, the integrated value of the pointing vectors is evaluated by the following expression.

$$TotS_z(k) = \Delta t \sum_{l=0}^{n} S_z^l(k)$$ [Expression 21]

From the value derived by such calculations as described above, there is calculated a spectrum of outgoing light from a light emitting device 1. Information indicating the calculated spectrum of outgoing light is output from the spectrum calculation section 12 to the peak resonance ratio calculation section 13 (S03 in FIG. 3, a spectrum information output step).

Subsequently, a peak resonance ratio "Z" is calculated by the peak resonance ratio calculation section 13 with respect to the light emitting device 1 for which the spectrum of outgoing light has been calculated (S04 in FIG. 3, a parameter output step). The calculated peak resonance ratio "Z" is output from the peak resonance ratio calculation section 13 to the output section 14.

Here, a determination is made whether or not a spectrum of outgoing light has been calculated for all combinations of layer thicknesses of a light emitting device 1 whose spectrum of outgoing light is to be calculated (S05). If the spectrum of outgoing light has not been calculated for all combinations of layer thicknesses, parameters for combinations of layer thicknesses different from already-calculated combinations of layer thicknesses are input from the input section 11 to the spectrum calculation section 12, so that the spectrum of outgoing light is calculated once again (S02 to S05).

On the other hand, if the spectrum of outgoing light has been calculated for all combinations of layer thicknesses, a determination is made by the output section 14 whether or not each calculated peak resonance ratio "Z" exceeds a previously-set threshold value. If a determination is made that the peak resonance ratio "Z" exceeds the previously-set threshold value, then parameters of the light emitting device 1 associated with the peak resonance ratio "Z" are output by the output section 14 (S06, a parameter output step). In addition, information indicating a spectrum of outgoing light from the light emitting device 1 calculated by the spectrum calculation section 12, information on the peak resonance ratio "Z", and the like may also be output along with those parameters. What has been described heretofore is an evaluation method for the device layer structure design of a light emitting device in accordance with the present embodiment.

Note that if any metal portion is contained in the light emitting device 1, the dispersion relation of the dielectric constant of the metal may be subjected to function fitting using one or more of functions of Debye type, Drude type, Lorenz type, rational function type, and the like, and may be used in one-dimensional FDTD simulation using an RC method. For the RC method, it is possible to suitably use the method described in "Finite Difference Time Domain Method for Electromagnetic Field and Antenna" mentioned earlier.

For a nonmetal portion of the light emitting device 1, the numerical value of the dielectric constant of the nonmetal portion may be directly used in one-dimensional FDTD simulation. Alternatively, however, the dispersion relation of the dielectric constant may be subjected to function fitting using one or more of functions of Debye type, Drude type, Lorenz type, rational function type, and the like, and may be used in one-dimensional FDTD simulation using an RC method in the same way as in the case of the metal portion.

In spectral calculation, calculations with respect to monochromatic light different in emission wavelength may be made for various emission wavelengths independently of one another. Alternatively, however, the calculations may be made using a pulse wave containing various emission wavelengths, such as a Gaussian pulse.

As described above, according to the present embodiment, a light emitting device 1 is divided into meshes only in the lamination direction (z-axis direction) of thin films constituting the light emitting device 1, in order to calculate a spectrum of outgoing light from the light emitting device 1 using an FDTD method. In this method, it is possible to take into consideration effects of multiple reflection in a boundary face of a multilayer film since the propagation of light is precisely solved.

In addition, in an evaluation method for the device layer structure design of a light emitting device in accordance with the present invention, mesh division (setting) is performed only in the lamination direction of thin films. Consequently, the number of meshes is greatly reduced, as compared with a conventional FDTD method in which two- or three-dimensional meshes are set. As a result, it is possible to evaluate outgoing light from a light emitting device including a structure, in which four or more layers of multilayer thin films are laminated, in a shorter period of computation time, as compared with conventional methods. Specifically, calculations can be made in a period of time as short as the ½ to ⅓ power of time required in conventional methods. Thus, it is possible to shorten a computation time of one year or so to a computation time of one week or so.

By including the thicknesses and refractive indexes of thin films 2 to 9 as parameters of the thin films 2 to 9 constituting a light emitting device 1 to be evaluated, which not only can be used for calculations but also can be varied, as in the present embodiment, it is possible to evaluate outgoing light from the light emitting device 1 and design the light emitting device 1 in a realistic computation time and in a reliable manner.

In addition, by evaluating a plurality of light emitting devices 1 different in parameters and using the results of evaluation, as in the present embodiment, it is possible to design a light emitting device 1 including a structure in which four or more layers of multilayer thin films are laminated and having desired performance, i.e., high in peak resonance ratio "Z". Furthermore, by making a determination using a peak resonance ratio "Z", as in the present embodiment, it is possible to appropriately and reliably design the light emitting device 1.

In the present embodiment, the evaluation of outgoing light is performed on a plurality of light emitting devices 1 and parameters of light emitting devices 1 which satisfy predetermined conditions are output, so that a user can verify the parameters. Alternatively, however, the evaluation of outgoing light may be performed on the light emitting devices 1 and the results of evaluation may be output, so that a user can verify the results (irrespective of the predetermined conditions).

Furthermore, a light emitting device 1, whose peak resonance ratio "Z" output by the evaluation method for the device layer structure design of a light emitting device in accordance with the present embodiment is 6.5 or higher, has a functionally preferred device structure. As described above, by setting a value based on information output by the evaluation method for the device layer structure design of a light emitting device in accordance with the present embodiment to within a specific range, it is possible to provide a light emitting device having a functionally preferred device structure.

EXAMPLE 1

Hereinafter, a description will be given to an example of the above-described embodiment. It should be noted however that the present invention is not limited to the below-described example. In the present example, the above-described light emitting device 1 illustrated in FIG. 1 was used as an object of evaluation.

As the thicknesses of respective layers 2 to 9, an air layer 30 was set to 100 nm, an Al metal 9c constituting an electrode 9 was set to 100 nm, a Ca layer 9b was set to 5 nm, an LiF layer 9a was set to 4 nm, an ITO layer 6 was set to 150 nm, a TiO$_2$ layer 5 was set to 50 nm, an SiO$_2$ layer 4 was set to 550 nm, a TiO$_2$ layer 3 was set to 130 nm, and a glass substrate 2 was set to 100 nm.

The refractive index distributions of the LiF layer 9a, the ITO layer 6, a PEDOT layer 7, a light-emitting layer 8, and the glass substrate 2 used in calculations for the purpose of evaluation are shown in FIGS. 7, 8, 9, 10 and 11, respectively. In addition, the refractive indexes of the TiO$_2$ layer 3 and the SiO$_2$ layer 4 were set to 2.3 and 1.46, respectively. For the dielectric constant dispersions of the Ca layer 9b and the Al metal 9c, 15 Drude type models were used to represent the dielectric constant dispersion of the Ca layer 9b and three Drude type models were used to represent the dielectric constant dispersion of the Al metal 9c. A Drude type model is represented by the following expressions.

$$\varepsilon_{re}(\omega) = 1 - \sum_j \frac{a_j \omega_j^{Drp}}{(\omega_j^{Dn})^2 + \omega^2} \qquad \text{[Expression 22]}$$

$$\varepsilon_{im}(\omega) = \sum_i \frac{a_j(\omega_j^{Drp})^2 \omega_j^{Drt}}{\omega\{(\omega_j^{Drt})^2 + \omega^2\}}$$

Here, $\varepsilon_{re}$ is the real part of a dielectric constant, $\varepsilon_{im}$ is the imaginary part of the dielectric constant, $a_j$, $\omega_j^{Drt}$ and $\omega_j^{Drp}$ are parameters, and $\omega$ is the angular frequency of light entering the Ca layer 9b or the Al metal 9c. The parameters of the Ca layer 9b and the Al metal 9c are shown in FIGS. 12 and 13, respectively.

Figure 14:
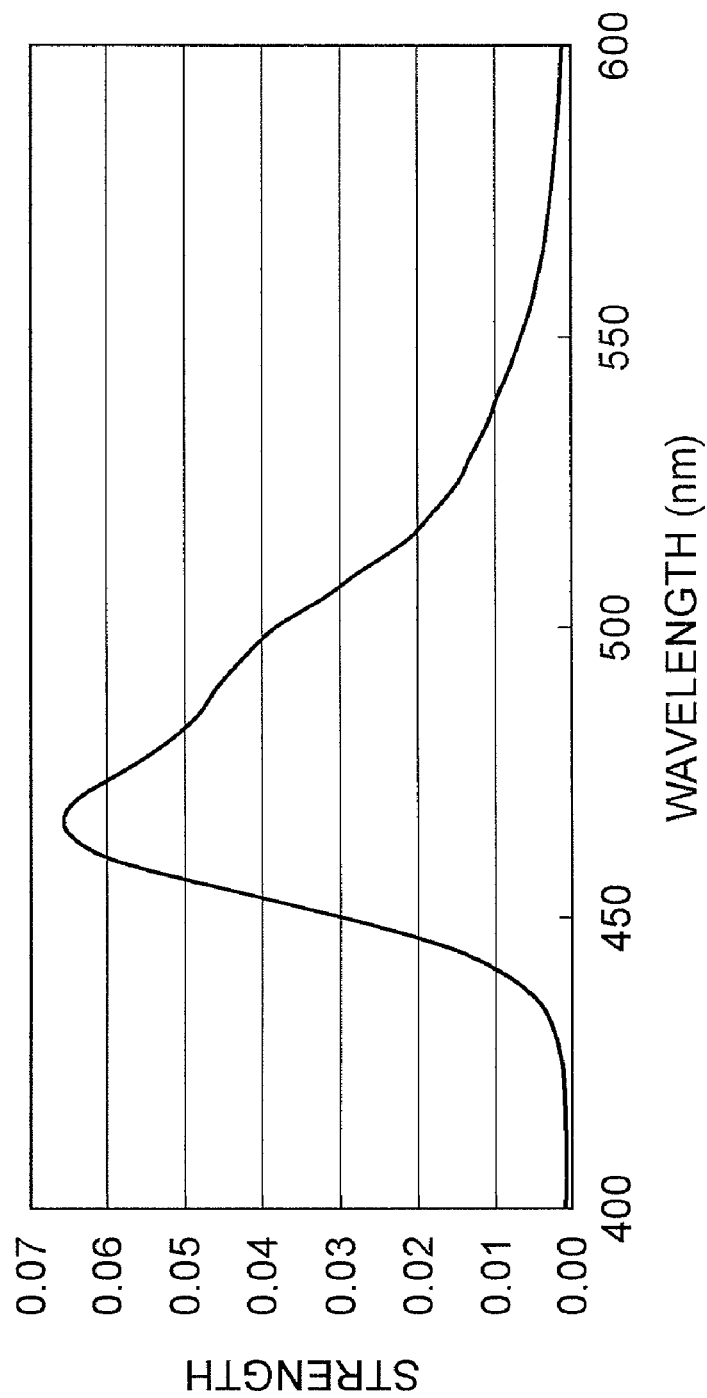
FIG. 14 is a graph illustrating an input spectrum used in an example of the present invention.

An evaluation was made by varying the thickness of the light-emitting layer 8 over the range of 20 nm to 350 nm and the thickness of the PEDOT layer 7 over the range of 10 nm to 350 nm, each layer being varied in 10 nm increments. In addition, using a one-dimensional FDTD method, wavelength-by-wavelength extraction efficiency was evaluated with respect to each layer thickness in increments of a 10 nm wavelength over the emission wavelength range of 300 nm to 800 nm. The phrase "extraction efficiency" as referred to herein is obtained by dividing the rate of energy flow per unit time and unit area within the glass substrate 2, which is a light output medium, by the amount of energy of light emitted per unit time and unit area at the light-emitting layer 8. A spectrum (output spectrum) of outgoing light within the glass substrate 2 was evaluated by multiplying a spectrum (input spectrum) of light emitted at the light-emitting layer 8 by the extraction efficiency. FIG. 14 illustrates the input spectrum used in the present example. When the extraction efficiency was evaluated using a one-dimensional FDTD method, the glass substrate 2 and the air layer 30 were defined as having absorption edges having corresponding dielectric constants and magnetic permeabilities (defined as absorbing boundaries), the location of emission was specified as a portion, 1 nm in width, within the light-emitting layer 8 and 1 nm away from the PEDOT layer 7.

From the input spectrum and the output spectrum, a peak resonance ratio "Z" was evaluated with respect to each layer thickness. The table of FIG. 15 shows the values of evaluated peak resonance ratios "Z" according to the thicknesses of the PEDOT layer 7 and the light-emitting layer 8. Note that the values shown in this table are those of relatively high peak resonance ratios "Z". Design of the optimum thicknesses of the PEDOT layer and the light-emitting layer of the same device structure using an existing method (Japanese Patent No. 3703028) showed that the thicknesses of the PEDOT layer and the light-emitting layer were 95 nm and 45 nm, respectively, and that a peak resonance ratio "Z" was 6.34. As shown in the table of FIG. 15, by designing a light emitting device having a multilayer film structure by making evaluations using a method in accordance with the present invention, it is possible to obtain a light emitting device 1 having a higher peak resonance ratio "Z", as compared with that obtained using the conventional method.

The invention claimed is:

1. An evaluation method for a device layer structure design of a light emitting device for evaluating outgoing light from the light emitting device including a structure having four or more layers of thin films, including a light-emitting layer, laminated therein, using an information processing apparatus, the method being characterized by including: an input step of inputting parameters of the thin films constituting the light emitting device and information indicating a spectrum of light emitted from the light-emitting layer; a spectrum calculation step of generating information based on the parameters input in the input step and indicating the light emitting device divided into meshes only in the lamination direction of the thin films, and calculating a spectrum of outgoing light from the light emitting device by an FDTD method using the generated information and the information indicating the spectrum of the light emitted from the light-emitting layer input in the input step; and a spectrum information output step of outputting information indicating the spectrum of outgoing light from the light-emitting device calculated in the spectrum calculation step.

2. The evaluation method for the device layer structure design of a light emitting device according to claim 1, characterized in that the parameters of the thin films include the thicknesses and the refractive indexes of the thin films.

3. The evaluation method for the device layer structure design of a light emitting device according to claim 1, further including a parameter output step of determining whether or not information indicating a spectrum of outgoing light from each light emitting device output in the spectrum information output step as the result that parameters of the thin films associated with a plurality of light emitting devices are input in the input step satisfies previously-set predetermined conditions, and outputting parameters of the thin films input in the input step for a light emitting device associated with information indicating the spectrum of the outgoing light that has been determined as satisfying the conditions.

4. The evaluation method for the device layer structure design of a light emitting device according to claim 3, characterized in that the previously-set predetermined conditions are such that the value of a ratio of strength at the peak frequency of the spectrum of the outgoing light to strength at the peak frequency of the spectrum of light emitted from the light-emitting layer is a predetermined threshold value or larger.

5. An evaluation apparatus for a device layer structure design of a light emitting device for evaluating outgoing light from the light emitting device including a structure having four or more layers of thin films, including a light-emitting layer, laminated therein, the evaluation apparatus being characterized by comprising: input means for inputting parameters of the thin films constituting the light emitting device and information indicating a spectrum of light emitted from the light-emitting layer; spectrum calculation means for generating information based on the parameters input by the input means and indicating the light emitting device divided into meshes only in the lamination direction of the thin films and calculating a spectrum of outgoing light from the light emitting device by an FDTD method using the generated information and the information indicating the spectrum of the light emitted from the light-emitting layer input by the input means; and spectrum information output means for outputting information indicating the spectrum of outgoing light from the light-emitting device calculated by the spectrum calculation means.

* * * * *